United States Patent [19]
Zeng

[11] Patent Number: 6,104,062
[45] Date of Patent: Aug. 15, 2000

[54] SEMICONDUCTOR DEVICE HAVING REDUCED EFFECTIVE SUBSTRATE RESISTIVITY AND ASSOCIATED METHODS

[75] Inventor: Jun Zeng, Mountaintop, Pa.

[73] Assignee: Intersil Corporation, Palm Bay, Fla.

[21] Appl. No.: 09/107,721

[22] Filed: Jun. 30, 1998

[51] Int. Cl.$^7$ .......................... H01L 29/76; H01L 29/94; H01L 31/062; H01L 31/113; H01L 31/119
[52] U.S. Cl. .......................... 257/341; 257/242; 257/762; 257/773; 257/775
[58] Field of Search ................................. 257/220, 242, 257/263, 341, 762, 778, 775, 773

[56] References Cited

U.S. PATENT DOCUMENTS

| | | | |
|---|---|---|---|
| 5,360,984 | 11/1994 | Kirihata ................................. | 257/143 |
| 5,541,430 | 7/1996 | Terashima ............................. | 257/342 |
| 5,552,340 | 9/1996 | Lee et al. .............................. | 437/190 |
| 5,578,841 | 11/1996 | Vasquez et al. ....................... | 257/120 |
| 5,629,535 | 5/1997 | Ajit ........................................ | 257/120 |
| 5,635,742 | 6/1997 | Hoshi et al. ........................... | 257/337 |
| 5,682,048 | 10/1997 | Shinohara et al. .................... | 257/342 |
| 5,756,371 | 5/1998 | Ohno et al. ............................ | 438/30 |
| 5,910,664 | 6/1999 | Ajit ........................................ | 257/212 |

OTHER PUBLICATIONS

Robert Weast, Handbook of Chemistry and Physics, 57th Edition, E–84 and F–126, Nov. 1976.

*Primary Examiner*—David Hardy
*Assistant Examiner*—Allan R. Wilson
*Attorney, Agent, or Firm*—Allen, Dyer, Doppelt, Milbrath & Gilchrist, P.A.

[57] ABSTRACT

A semiconductor device includes at least one device active region formed in a first surface of a semiconductor substrate, an electrical contact layer on a second surface of the semiconductor substrate, and at least one resistivity-lowering body positioned in a corresponding recess in the substrate and connected to the electrical contact layer. The body preferably comprises a material having an electrical resistivity lower than an electrical resistivity of the semiconductor substrate to thereby lower an effective electrical resistivity of the substrate. The device active region may be an active region of a power control device, such as a MOSFET or IGBT, for example. The body may preferably comprise an electrical conductor such as copper, aluminum, silver, solder, or doped polysilicon. The at least one recess and associated resistivity-lowering body preferably defines a proportion of the semiconductor substrate area adjacent the device active region greater than about 0.4 percent, and may extend into the semiconductor substrate a distance greater than about 25 percent of a thickness of the substrate.

49 Claims, 7 Drawing Sheets

SEMICONDUCTOR DEVICE HAVING REDUCED EFFECTIVE SUBSTRATE RESISTIVITY AND ASSOCIATED METHODS

FIELD OF THE INVENTION

The present invention relates to semiconductors, and, more particularly, to a semiconductor device, such as a power MOSFET having reduced on-resistance.

BACKGROUND OF THE INVENTION

Semiconductor devices, typically in the form of integrated circuits, are widely used in almost all electronic equipment, such as handheld calculators, personal computers, automobiles, cellular telephones, and sophisticated mainframe computers. A typical semiconductor device includes a semiconductor substrate which, in turn, includes a number of active devices formed adjacent a first surface of the substrate. For example, one or more power metal-oxide semiconductor field-effect transistors (MOSFETs) may be formed in active regions of the substrate. Power MOSFETs are often used because of their relatively high switching speeds as compared to bipolar transistors, for example. Power MOSFETs may be used in power conversion or motor control circuitry.

The so-called "on-resistance" of a power MOSFET affects its power handling capability, as well as its operating energy efficiency. A higher on-resistance translates into greater power dissipation required for the chip. In addition, for portable battery-powered devices, for example, higher energy efficiency may be a primary concern to thereby extend battery life. In other words, in many applications it may be desired to provide low-voltage MOSFETs with a lower on-resistance.

To address this goal, the power semiconductor industry has been adopting very large scale integration (VLSI) technologies to increase device cell densities. For example, U.S. Pat. No. 5,635,742 to Hoshi et al. discloses a lateral double-diffused MOSFET wherein source and drain openings are cyclically arranged so that at least two rows of source openings are arranged between adjacent drain openings to thereby reduce the on-resistance. Such common approaches to reducing the on-resistance have concentrated on reducing the contribution to the on-resistance of the scalable components of the integrated circuit, such as channel resistance.

Unfortunately, the on-resistance contribution from the unscalable regions of the integrated circuit, such as the substrate, for example, remain constant even as cell densities are increased. Moreover, as the cell densities increase further, the substrate on-resistance becomes almost a dominating factor for lower-voltage power MOSFETs which typically operate at less than about 30 V. For example, a 14 mil thick, N-type substrate with a resistivity of 4.5 mΩ.cm has a specific on-resistance of 0.16 mΩ.cm$^2$. The relatively high resistivity of conventional substrates may also cause undesired contact resistance with a backside contact layer, for example.

Currently, the die specific on-resistance of a 30 V MOSFET as offered by Fairchild under the designation FDS 6680, for example, has a specific on-resistance of 0.279 mΩ.cm$^2$. This demonstrates that if the 14 mil substrate was used, more than half of the device specific on-resistance would come from the substrate. Accordingly, one of the most significant efforts for producing the next generation of power MOSFETs will be to reduce the specific on-resistance of the substrate.

Since the substrate specific on-resistance is the product of its thickness and resistivity, there are two ways to reduce the specific on-resistance. The first is simply to thin the wafer from which the device is made. The second approach is to lower the substrate resistivity. Unfortunately, thinning the wafer is complicated and relatively expensive. In addition, too thin of a substrate may be difficult to handle and the production yield may be too low. Relating to lowering the resistivity of the substrate, the resistivity is currently limited by the silicon or other semiconductor material properties.

SUMMARY OF THE INVENTION

In view of the foregoing background, it is therefore an object of the present invention to provide a semiconductor device and associated manufacturing method for reducing the effective substrate resistivity, such as to reduce specific on-resistance for power MOSFETS, for example.

This and other objects, features, and advantages in accordance with the present invention are provide by a semiconductor device comprising at least one device active region formed in a first surface of a semiconductor substrate, an electrical contact layer on a second surface of the semiconductor substrate, and at least one resistivity-lowering body positioned in a corresponding recess in the substrate and connected to the electrical contact layer. The at least one resistivity-lowering body preferably comprises a material having an electrical resistivity lower than an electrical resistivity of the semiconductor substrate to thereby lower an effective electrical resistivity of the substrate.

In one embodiment, the resistivity-lowering body preferably fills an associated recess. In addition, the device active region may be an active region of a power control device, such as a MOSFET or IGBT, for example. The at least one device active region may be provided by a plurality of power control device cells, for example. The lowered effective resistivity of the substrate is particularly advantageous for a discrete power MOSFET having a breakdown voltage of less than about 50 V, and, more preferably less than about 30 V.

The resistivity-lowering body may preferably be an electrical conductor having a resistivity less than about 10$^{-4}$ Ω.cm. For example, the material may be a metal, such as copper, aluminum, silver or solder. A barrier metal layer, such as titanium, may be provided between the resistivity-lowering body metal and the substrate.

In addition, the resistivity-lowering body may comprise polysilicon. The polysilicon may have its resistivity reduced by doping.

To reduce the contact resistance, a more highly doped layer may be formed in the substrate adjacent the resistivity-lowering bodies. A lower resistivity substrate on the order of 3 mΩ.cm, for example, may also be used to lower the contact resistance.

The at least one recess and associated resistivity-lowering body preferably defines a proportion of the semiconductor substrate area adjacent the device active region greater than about 0.4 percent. The at least one recess and associated resistivity-lowering body preferably extends into the semiconductor substrate a distance greater than about 25 percent of a thickness of the semiconductor substrate.

In one particularly readily manufactured version of the semiconductor device, the at least one recess and associated resistivity-lowering body comprise an array of recesses and associated resistivity-lowering bodies. The recesses may be formed by sawing, cutting and/or etching a grid of intersecting trenches in the second surface of the substrate. Alternately, a plurality of individual spaced apart recesses and associated bodies may be provided.

The semiconductor substrate may comprise silicon, for example. In addition, since a metal, such as copper or aluminum may be used for the resistivity-lowering bodies, the thermal resistivity of these materials is typically lower than silicon, for example. Accordingly, power dissipation from the substrate is also enhanced.

A method aspect of the invention is for making a semiconductor device comprising a semiconductor substrate having a lowered effective electrical resistivity. The method preferably comprises the steps of: forming at least one device active region in the semiconductor substrate adjacent a first surface thereof; forming at least one recess extending from a second surface of the substrate, opposite the first surface, into interior portions of the semiconductor substrate; and forming at least one resistivity-lowering body in the least one recess of the semiconductor substrate. The at least one resistivity-lowering body preferably comprises a material having an electrical resistivity lower than an electrical resistivity of the semiconductor substrate. The method also preferably includes the step of forming an electrical contact layer on the second surface of the semiconductor substrate being electrically connected to the at least one resistivity-lowering body.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and the thicknesses of certain layers may be exaggerated in the drawings for clarity.

Figure 1:
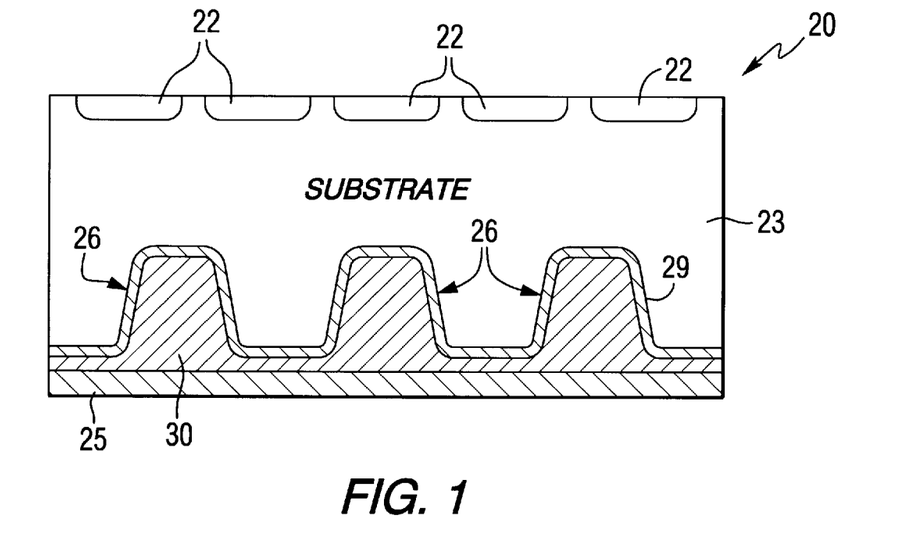
FIG. 1 is a schematic cross-sectional view of a semiconductor device in accordance with the present invention.
Figure 2:
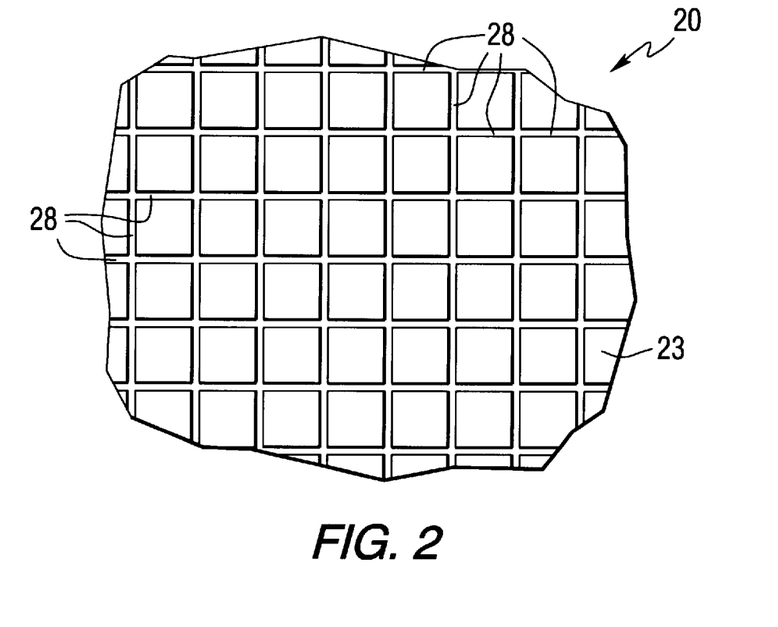
FIG. 2 is an enlarged schematic bottom plan view of an embodiment of the semiconductor device in accordance with the present invention with the contact layer removed to illustrate a grid pattern of recesses for resistivity-lowering bodies in the substrate.

Referring initially to FIGS. 1 and 2 an embodiment of a semiconductor device 20 having a lowered effective substrate resistivity is described. The lowered effective substrate resistivity results in a lowered specific on-resistance, for example, when the invention is implemented in a power MOSFET device, for example, as will be readily appreciated by those skilled in the art. The semiconductor device 20 illustratively includes a plurality of device active regions 22 formed in a first or upper surface of a semiconductor substrate 23. An electrical contact layer 25 is provided on a second surface or backside of the semiconductor substrate 23. Moreover, a plurality of resistivity-lowering bodies 26 are positioned in corresponding recesses in the substrate 23 and are connected to the electrical contact layer 25. The resistivity-lowering bodies 26 each preferably comprises a material having an electrical resistivity lower than an electrical resistivity of the material of the semiconductor substrate 23 to thereby lower an effective electrical resistivity of the substrate. The term "effective electrical resistivity" is used herein to describe the resulting lowered resistivity of the substrate structure incorporating the resistivity-lowering bodies 26.

As shown in the illustrated embodiment, a barrier layer 29, such as may be provided by a thin layer of titanium, for example, may be sputter deposited to line the recess and extend along the backside of the substrate 23 as will be readily appreciated by those skilled in the art. The titanium may have a thickness of about 1000 Å, for example. The metal layer 30 includes portions which extend into the recesses and define along with the adjacent portions of the barrier layer 29, in the illustrated embodiment, the resistivity-lowering bodies 26.

As would be readily appreciated by those skilled in the art, in other embodiments, the semiconductor device 20 may include only a single device active region. In addition, the semiconductor device 20 in other embodiments may also have only a single resistivity-lowering body 26.

In the illustrated embodiment, each resistivity-lowering body 26 fills an associated recess of the substrate 23. By filling the recess, greater mechanical integrity and, thus, greater handling strength may be imparted to the substrate 23, and, hence, to the overall semiconductor device 20. Stress reduction may also be provided by filling the recesses. In addition, it may typically be easier from a manufacturing standpoint to completely fill the recesses with a conductive material to form the bodies 26 as will also be readily appreciated by those skilled in the art.

As shown in the bottom plan view of FIG. 2, the semiconductor device 20 prior to the metallization step to form the contact layer 25 illustratively includes recesses 28 arranged in a grid pattern of intersecting cuts, such as, for example, orthogonal cuts, in the backside of the substrate 23. The grid pattern may be easily produced by cutting with a conventional saw as used in semiconductor manufacturing as will be appreciated by those skilled in the art. The recesses 28 may be further etched to better prepare the recesses to receive a metallization layer as will also be understood by those skilled in the art. One or more diagonal cuts, not shown, may also be made to increase the total area of the resistivity-lowering bodies 26.

Figure 3:
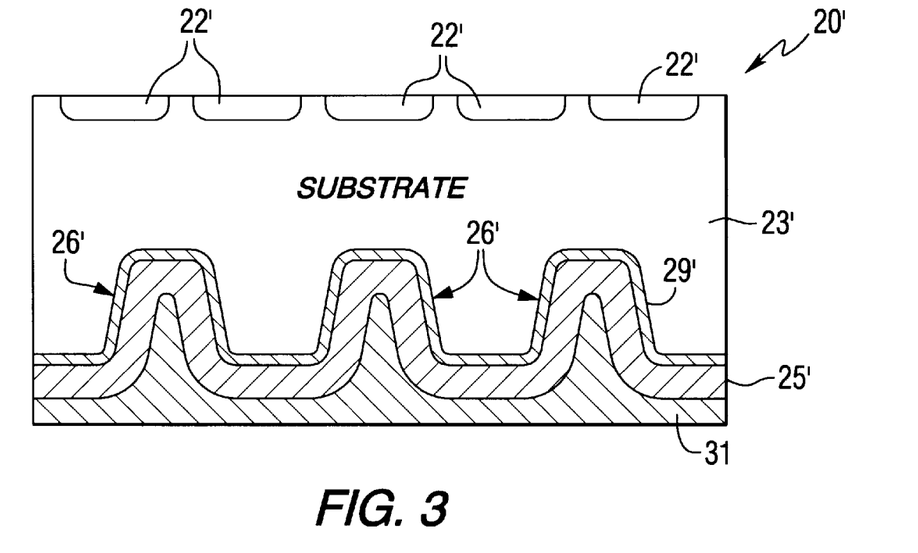
FIG. 3 is a schematic cross-sectional view of another embodiment of the semiconductor device in accordance with the present invention.

FIG. 3 illustrates another embodiment of the device 20' wherein the backside contact layer 25' is adjacent the barrier layer 29', and wherein the contact layer includes portions which partially fill the recesses in the substrate 23'. In this embodiment the bodies 26' may further include filling portions of the solder layer 31 as shown in the illustrated embodiment. The solder layer 31 may typically be provided during assembly of the integrated circuit device. In other words, the integrated circuit die is manufactured to include the partially filled recesses and associated bodies 26' having voids which are filled during final assembly by the illustrated solder layer 31.

Figure 4:
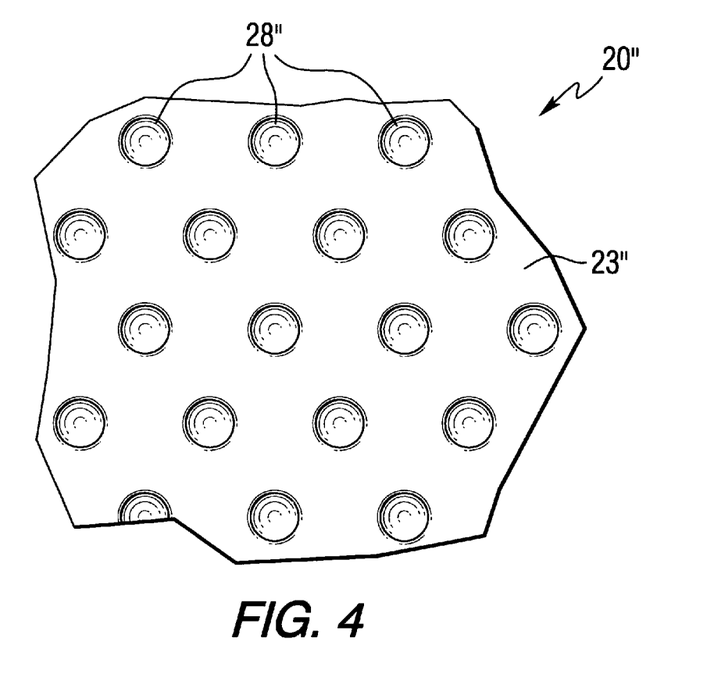
FIG. 4 is an enlarged schematic bottom plan view of another embodiment of the semiconductor device in accordance with the present invention with the contact layer removed to illustrate an array of spaced apart recesses for the resistivity-lowering bodies in the substrate.

The bottom plan view of FIG. 4 illustrates another embodiment of the semiconductor device 20" with the recesses 28" in the form of a series of spaced apart generally cylindrical recesses in the backside of the substrate 23". The generally cylindrical recesses 28" may be formed by conventional laser etching techniques as will also be readily appreciated by those skilled in the art. The sharp edges produced by the laser etching may be rounded by an additional etching step to better prepare the recesses 28" to receive the metallization layer which provides the resistivity-lowering bodies 26, and which may also provide the contact layer 25. The recesses 28", in other embodiments may have shapes other than the illustrated circular cylinders as will be appreciated by those skilled in the art.

Figure 5:
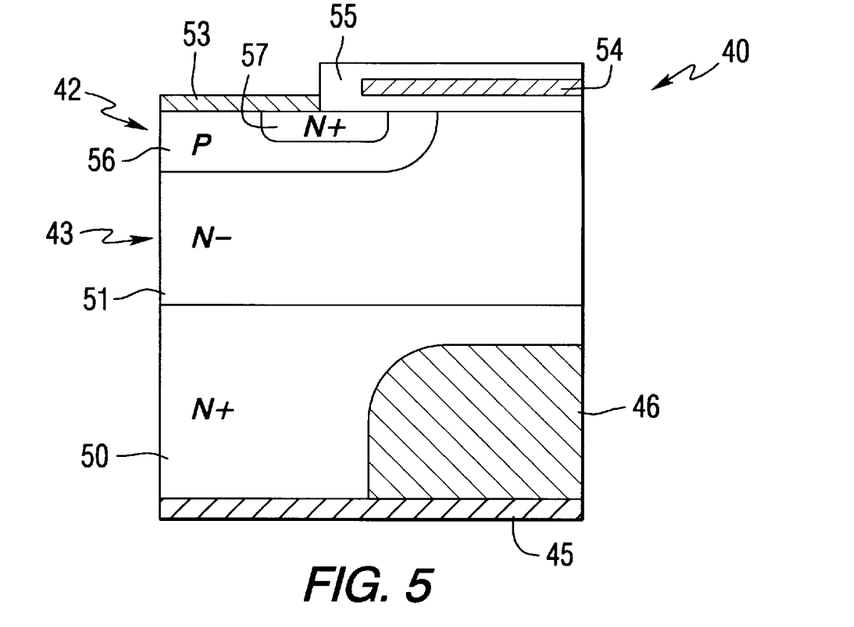
FIG. 5 is a schematic cross-sectional view of a portion of a power MOSFET semiconductor device in accordance with the invention.

Turning now more particularly to FIG. 5, an embodiment of the semiconductor device 40 including a power MOSFET is now described. The device 40 includes a substrate 43, a backside or drain contact layer 45, and an active region 42 at the upper surface. A portion of one of the resistivity-lowering bodies 46 is shown in the lower right-hand portion of the cross-sectional view. The body 46 extends into the substrate 43 and is connected to the drain contact layer 45. The illustrated substrate 43 includes an N+ region 50 adjacent the drain contact layer 45, and an N–drift region 51 above the N+ region. A source contact layer 53, and a gate layer 54 and its gate insulating layer 55 are on the upper surface of the substrate 43. A P region 56 and an N+ region 57 are formed in the substrate adjacent the upper surface of the substrate 43 as illustrated.

Only a single power MOSFET device is illustrated in the semiconductor device 40, although it will be readily understood by those skilled in the art that in many applications a plurality of cells of such MOSFET device structures may be formed, such as for a discrete power device. The power MOSFET may also have other equivalent structures as will be readily appreciated by those skilled in the art. In addition, the one or more power MOSFETs may also be included on an integrated circuit with other circuit components as well.

The resistivity-lowering body 46 serves to lower the specific on-resistance of the power MOSFET formed in the substrate 43. The lowered effective resistivity of the substrate is particularly advantageous for a discrete power MOSFET having a breakdown voltage of less than about 50 V, and, more preferably less than about 30 V. For these devices, the substrate resistivity is a significant overall component of the specific on-resistance of the device.

Another component of the specific on-resistance of the device 40 may be the contact resistance. Accordingly, the substrate may include a more highly doped region, such as the N+ region 50 adjacent the resistivity-lowering bodies 46, or alternately, a substrate having a lower initial resistivity of about 3 mΩ.cm may be used to reduce the contribution of the contact resistance as will be readily appreciated by those skilled in the art. The more heavily doped substrate region may have a dopant concentration of about $6 \times 10^{19}$ atoms/$cm^3$, for an N type substrate, for example. The lower initial resistivity substrate may offer an advantage in avoiding an additional doping step as will be appreciated by those skilled in the art.

Figure 6:
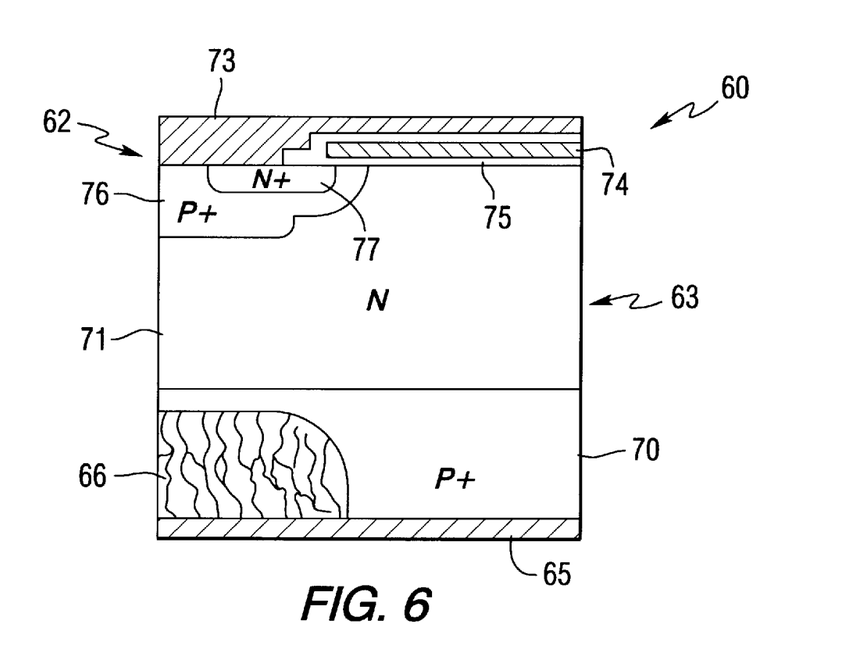
FIG. 6 is a schematic cross-sectional view of a portion of a power IGBT semiconductor device in accordance with the invention.

Turning now more particularly to FIG. 6, a semiconductor device 60 including an insulated gate bipolar transistor (IGBT) structure is shown also including a portion of a resistivity-lowering body 66 which provides a lower forward voltage drop for the device as will be appreciated by those skilled in the art. The resistivity-lowering body 66 is illustratively formed of doped polysilicon, although metals may also be used. The polysilicon may be doped to about $6 \times 10^{19}$ atoms/$cm^3$, for example.

The IGBT illustratively includes a collector contact layer 65, a P+ layer 70 adjacent the collector contact and formed in the substrate 63, and an N region 71 of the substrate above the P+ region. An emitter contact 73, and a gate insulating layer 75 and gate layer 74 are also provided as would be readily understood by those skilled in the art. A P+ region 76 and an N+ region 77 are also formed adjacent the upper surface of the substrate 63. The semiconductor device 60 may include a plurality of IGBTs, or may include other circuit components as will also be appreciated by those skilled in the art.

Focusing now on the embodiments of the invention including one or more power MOSFETs, the present invention provides a lower specific on-resistance for such devices. In particular, as noted above in the background, wafer thinning is an approach to reduce the substrate electrical and thermal resistance. Unfortunately, wafer thinning is relatively difficult and the resulting thinned wafer may be too fragile to handle for further processing. Wafer yield may also be significantly lowered for thinned wafers.

The present invention provides for a lowered effective substrate resistivity without requiring thinning, although the invention may also be advantageously used in conjunction with wafer thinning and/or in conjunction with a lower resistivity substrate. The resistivity-lowering bodies may preferably be an electrical conductor having a resistivity less than about $10^{-4}$ Ω.cm. For example, the material of the bodies may be a metal, such as copper, aluminum or silver which have resistivities approaching $10^{-6}$ Ω.cm. Typical resistivities for commercially available substrates may be about 2 to 5 mΩ.cm, for example. The resistivity-lowering bodies will, of course, have a resistivity less than the semiconductor material of the substrate, and, for the case of metals such as aluminum, copper and silver, the resistivities are several orders of magnitude lower than for the silicon substrates. Accordingly, as will be seen below, only a relatively small amount of the resistivity-lowering material will be needed to make significant improvements in the specific on-resistance.

The specific on-resistance of the substrate $R_{sp(substrate)}$ including the resistivity-lowering bodies in accordance with the present invention is given to a first order by:

$$R_{sp(substrate)} = \frac{\rho_{si}\rho_{body}t_{body}}{\lambda\rho_{si} + (1-\lambda)\rho_{body}} + \rho_{si}(t_{substrate} - t_{body})$$

wherein $\rho_{si}$ and $\rho_{body}$ are the resistivities of the silicon substrate and body material, respectively;

$t_{substrate}$ and $t_{body}$ are the thicknesses of the substrate and bodies, respectively; and $\lambda$ is a ratio of the area of the bodies to the total substrate area.

Figure 7:
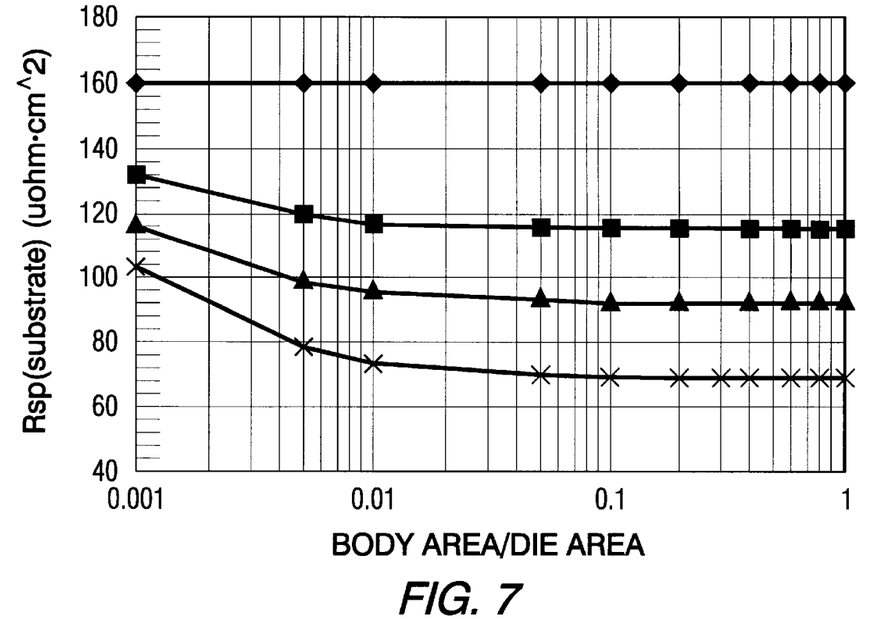
FIG. 7 is a graph of specific on-resistances versus percentage of body area to die area for a first set of examples.

A set of examples where the body material is aluminum, and the substrate has a thickness of 14 mil and a resistivity of 4.5 mΩ.cm are plotted in FIG. 7. More particularly, the uppermost horizontal plot with the diamond markers illustrates the specific on-resistance of the substrate without any resistance-lowering bodies. The plot second from the top and having the square markers is for a thickness of the aluminum bodies of 4 mil. The plot third from the top and having the triangular markers is for a thickness of the bodies of 6 mil. Lastly, the bottom plot indicated with X markers is for a thickness of the bodies of 8 mil. The X-axis is the ratio or proportion of the area of the bodies to the die area.

The term area is correct when the bodies have a uniform shape extending into the substrate. In other words, the analysis assumes that the sidewalls of the recesses and bodies are at 90° from the backside surface so that the area of the bodies is the same along their depth of penetration into the substrate. However, the area may also be an effective or average area as will be readily appreciated by those skilled in the art to cover other shapes of recesses and bodies. For example, the area for trapezoidal shape recesses and bodies is larger at the backside surface than at the termination in the substrate. Accordingly, in this instance the term area will be understood to define the effective area defined by the trapezoidal bodies.

The plotted results indicate, for example, that for a body thickness of 8 mil, the aluminum bodies need only cover about one percent of the area to lower the specific on-resistance to less than half its original value (160 lowered to about 70 $\mu\Omega$.cm$^2$). The marginal lowering of the specific on-resistance levels off beyond about 1 percent, for all three of the body thicknesses plotted in FIG. 7. In addition, a substantial marginal lowering of resistivity occurs for a proportion of as little as 0.4 percent as also seen from the plots of FIG. 7. Accordingly, the recesses and associated resistivity-lowering bodies preferably define a proportion of the semiconductor substrate area adjacent the device active region greater than or equal to about 0.4 percent. As noted, marginal gains for a proportional area above 1 percent are slight. Thus, a preferred range may be between about 0.4 and 1 percent, for example, when using a conductive metal, such as aluminum, for the material of the bodies.

The recesses and associated resistivity-lowering bodies provide a significant lowering of the specific on-resistance with a body thickness of only 4 mils for a 14 mil substrate. Accordingly, the thickness of the resistivity-lowering bodies may be greater than or equal to about 25 percent of the thickness of the substrate.

Figure 8:
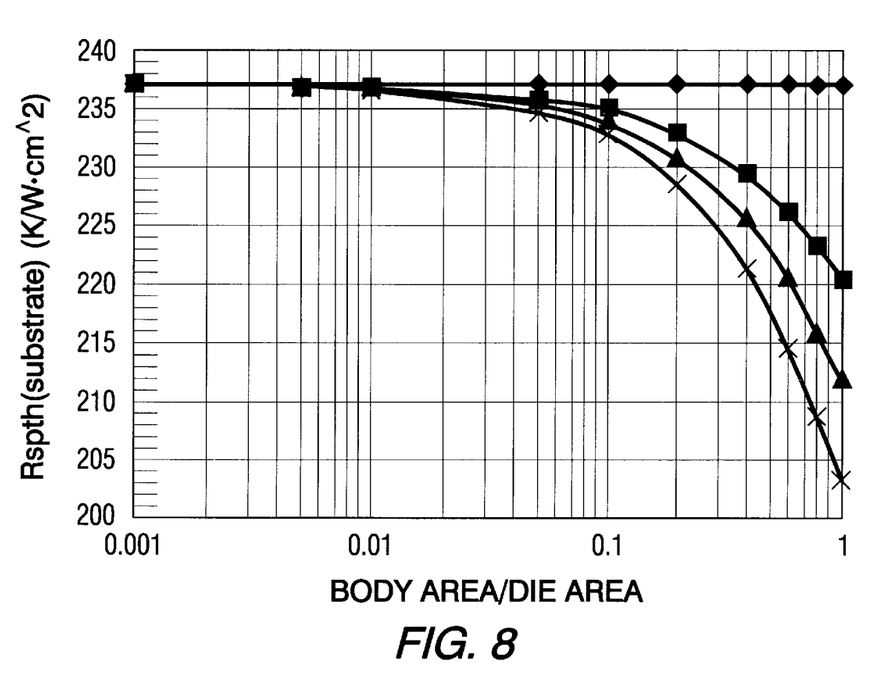
FIG. 8 is a graph of specific thermal resistances versus percentage of body area to die area for the first set of examples.

The semiconductor substrate may comprise silicon, for example. In addition, since a metal, such as copper or aluminum may be used for the resistivity-lowering bodies, the thermal conductivity of these materials is typically higher than silicon, for example. Accordingly, power dissipation from the substrate is also enhanced by the presence of the resistivity-lowering bodies. The plots of FIG. 8 illustrate the specific thermal resistances for the substrate for each of the four thickness of bodies as explained above with reference to FIG. 7. In particular, these plots indicate that the specific thermal resistance is not significantly lowered until the percentage of the area of the bodies is increased beyond 1 percent, and more preferably, beyond 10 percent or more.

Figure 9:
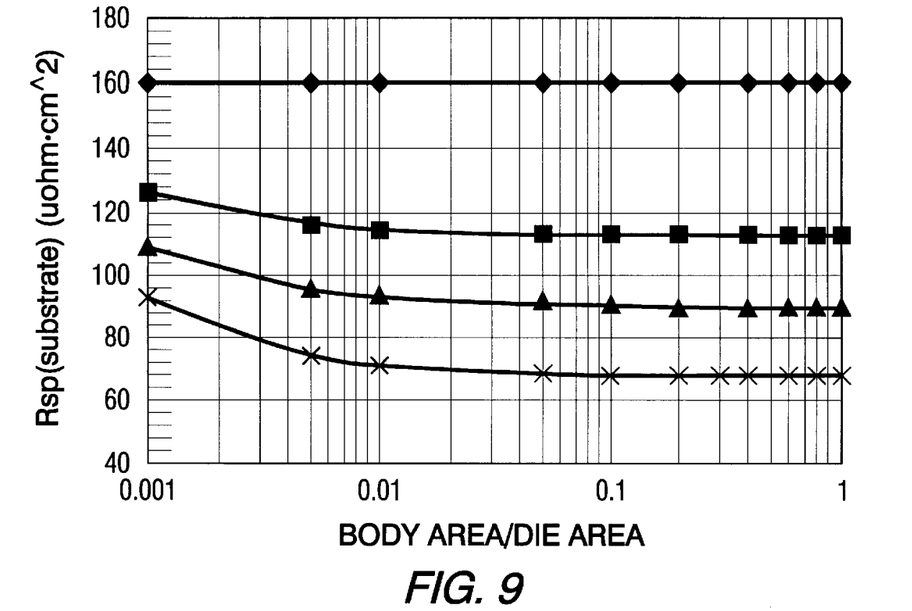
FIG. 9 is a graph of specific on-resistances versus percentage of body area to die area for a second set of examples.
Figure 10:
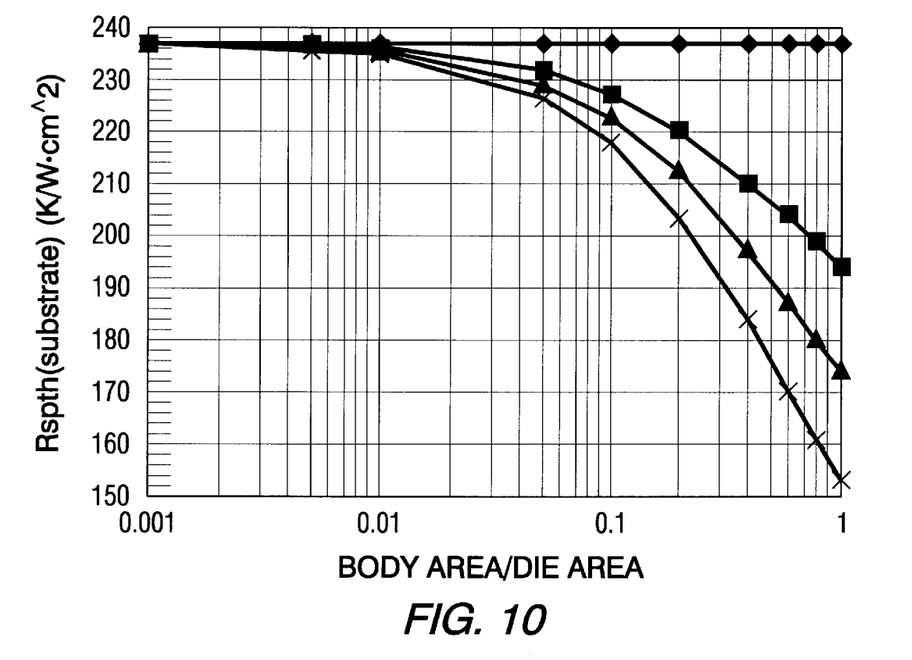
FIG. 10 is a graph of specific thermal resistances versus percentage of body area to die area for the second set of examples.

Turning now to FIGS. 9 and 10 plots of specific on-resistance and specific thermal resistance, respectively, are given for a second set of examples where copper is used as the material for the resistivity-lowering bodies. In particular, the substrate has a thickness of 14 mil and a resistivity of 4.5 mΩ.cm. The uppermost plot with the diamond markers illustrates the specific on-resistance of the substrate without any resistance-lowering bodies. The plot having the square markers is for a thickness of the copper bodies of 4 mil. The plot third from the top and having the triangular markers is for a thickness of the bodies of 6 mil. The bottom plot indicated with X markers is for a thickness of the bodies of 8 mil. Because of the slightly lower electrical resistivity of copper as compared to aluminum, the lowering of the specific on-resistance of the substrate is greater for this set of examples using copper. Because copper also has a lower thermal resistivity, it also provides a slight improvement as compared to aluminum.

Figure 11:
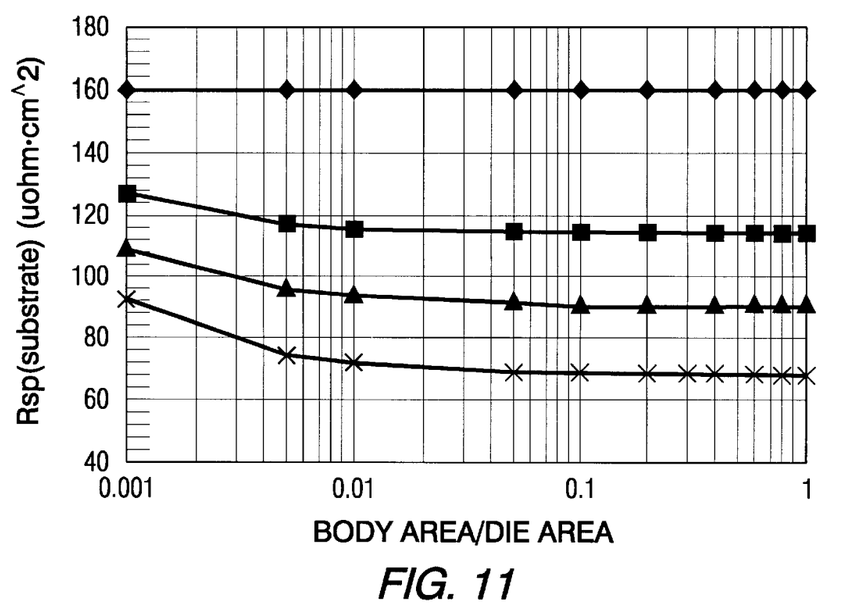
FIG. 11 is a graph of specific on-resistances versus percentage of body area to die area for a third set of examples.
Figure 12:
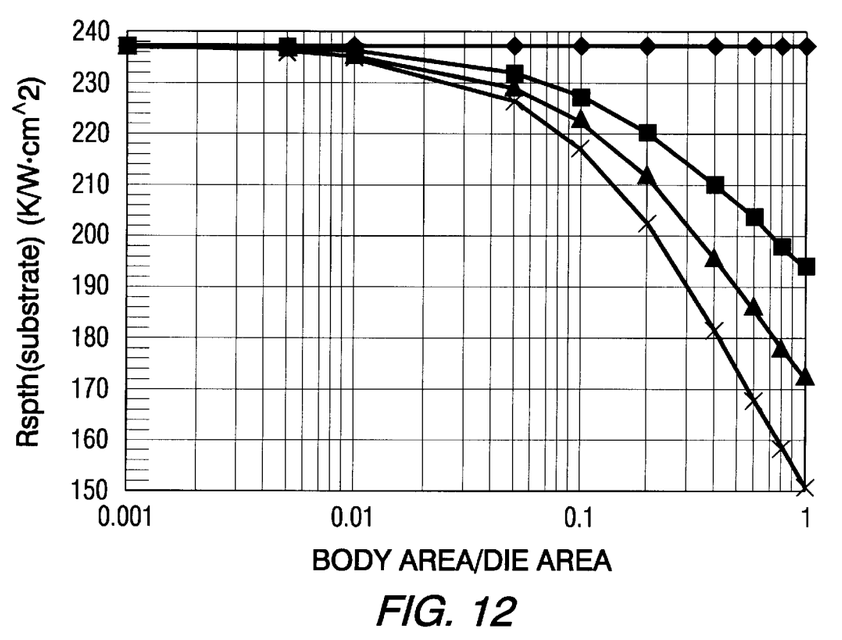
FIG. 12 is a graph of specific thermal resistances versus percentage of body area to die area for the third set of examples.

Turning now to FIGS. 11 and 12, similar plots of specific on-resistance and specific thermal resistance are shown for a third set of examples where the material of the bodies is silver. Silver has a lower electrical resistivity than both copper and aluminum and this is reflected in the slightly better performance in lowering the specific on-resistance. The various plots are for the same conditions/parameters as described above, but for the use of silver as the material for the resistivity-lowering bodies. Accordingly, these plots need no further discussion herein.

Figure 13:
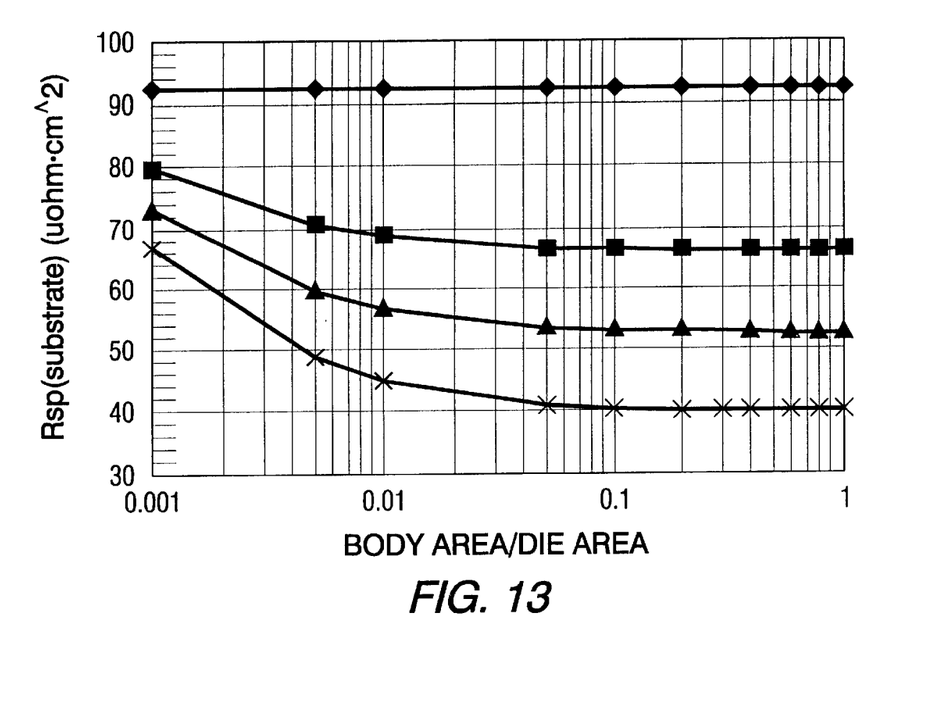
FIG. 13 is a graph of specific on-resistances versus percentage of body area to die area for a fourth set of examples.

The use of the resistivity-lowering bodies is also advantageous even for a substrate having a relatively low initial resistivity as will understood with reference to the plots of FIG. 13. In particular, in this set of examples the substrate has a thickness of 14 mil and a resistivity of only 2.6 mΩ.cm. Aluminum is the material used for the bodies in this example set. The uppermost horizontal plot with the diamond markers illustrates the specific on-resistance of the substrate without any resistivity-lowering bodies. The plot having the square markers is for a thickness of the bodies of 4 mil. The plot third from the top and having the triangular markers is for a thickness of the bodies of 6 mil. The bottom plot indicated with X markers is for a thickness of the bodies of 8 mil. This additional set of examples indicates the desirability of the resistivity-lowering bodies even for a substrate having a relatively low initial resistivity.

Figure 14:
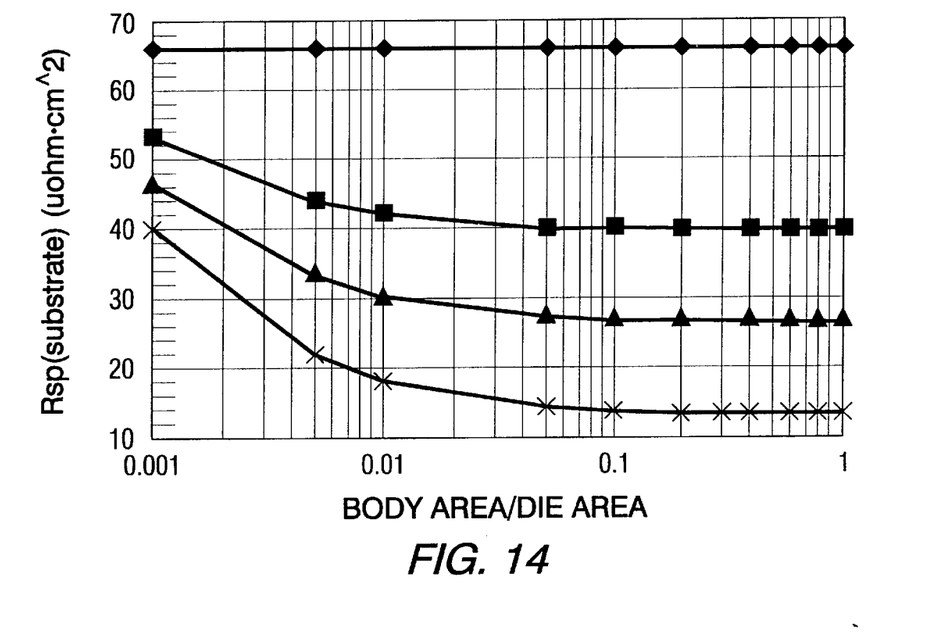
FIG. 14 is a graph of specific on-resistances versus percentage of body area to die area for a fifth set of examples.

FIG. 14 provides yet another set of examples wherein the starting substrate is thinner than for the example sets given above. More particularly, the substrate for these illustrated examples is only 10 mil thick. Aluminum is used for the material of the bodies. Each of the plots is for the respective thicknesses as described above. Since the percentage of penetration of the bodies with respect to the overall thickness of the substrate is higher for the 10 mil substrate, the lowering of the specific on-resistance is also greater.

A method aspect of the invention is for making a semiconductor device comprising a semiconductor substrate having a lowered effective electrical resistivity. The method preferably comprises the steps of: forming at least one device active region in the semiconductor substrate adjacent a first surface thereof; forming at least one recess extending from a second surface of the substrate, opposite the first surface, into interior portions of the semiconductor substrate; and forming at least one resistivity-lowering body in the least one recess of the semiconductor substrate. The at least one resistivity-lowering body preferably comprises a material having an electrical resistivity lower than an electrical resistivity of the semiconductor substrate. The method also preferably includes the step of forming an electrical contact layer on the second surface of the semiconductor substrate being electrically connected to the at least one resistivity-lowering body.

As described above with respect to the embodiment of the semiconductor device 20 in FIG. 2, a semiconductor saw may be used to form a pattern of recesses 28 by cutting into the backside of the wafer before the individual die are cut from the wafer. A recess 28 in the form of a trench may have relatively sharp corners or edges. Accordingly, a further etching step may be performed to soften the corners and round the edges to better receive a metallization layer. A trapezoidal shape may also be desired for receiving a polysilicon deposition. Chemo-mechanical polishing (CMP) techniques may also be used as will be readily understood by those skilled in the art. The pattern of recesses and associate bodies may define a grid having a spacing of about 200–2000 μm, and wherein the width of each body is about 10–100 μm, for example.

Of course those of skill in the art will appreciate other equivalent methods for forming the recesses and filling same with the resistivity-lowering bodies. In addition, other devices, such as MOS-controlled thyristors (MCTs), for example, and other similar devices may also benefit from the substrate resistivity lowering concepts of the present invention as will be appreciated by those skilled in the art. A microprocessor integrated circuit having a general schematic cross-section as shown in FIG. 1 may also benefit especially from the increased thermal conductivity of the bodies to thereby dissipate heat. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A semiconductor device comprising:
   a semiconductor substrate having opposing first and second surfaces, and having at least one recess extending from the second surface into interior portions;
   at least one device active region formed in said semiconductor substrate adjacent the first surface thereof;
   an electrical contact layer on the second surface of said semiconductor substrate; and
   at least one resistivity-lowering body positioned in said at least one recess of said semiconductor substrate and connected to said electrical contact layer, said at least one resistivity-lowering body comprising a material different than said semiconductor substrate and having an electrical resistivity-lowering than an electrical resistivity of said semiconductor substrate tto thereby lower an effective electrical resistivity thereof.

2. A semiconductor device according to claim 1 wherein said at least one resistivity-lowering body fills an associated recess.

3. A semiconductor device according to claim 1 further comprising a barrier layer positioned between said at least one resistivity-lowering body and the corresponding recess.

4. A semiconductor device according to claim 1 wherein said at least one resistivity-lowering body comprises an electrical conductor having a resistivity less than about $10^{-4}$ Ω.cm.

5. A semiconductor device according to claim 1 wherein said at least one recess and associated resistivity-lowering body defines a proportion of the semiconductor substrate area adjacent said at least one device active region greater than about 0.4 percent.

6. A semiconductor device according to claim 1 wherein said at least one recess and associated resistivity-lowering body extends into said semiconductor substrate a distance greater than about 25 percent of a thickness of said semiconductor substrate.

7. A semiconductor device according to claim 1 wherein said at least one recess and associated resistivity-lowering body comprises an array of recesses and associated resistivity-lowering bodies.

8. A semiconductor device according to claim 7 wherein said array of recesses and associated resistivity-lowering bodies are arranged in a grid pattern.

9. A semiconductor device according to claim 1 wherein said at least one device active region comprises at least one active region of a metal-oxide semiconductor field-effect transistor (MOSFET).

10. A semiconductor device according to claim 9 wherein said MOSFET has a breakdown voltage of less than about 50 volts.

11. A semiconductor device according to claim 1 wherein said at least one device active region comprises at least one active region of an insulated gate bipolar transistor (IGBT).

12. A semiconductor device according to claim 1 wherein said at least one device active region comprises at least one active region of a microprocessor.

13. A semiconductor device according to claim 1 wherein said substrate further comprises a doped layer adjacent said at least one resistivity-lowering body, and wherein said doped layer has a doping concentration greater than adjacent portions of said semiconductor substrate.

14. A semiconductor device according to claim 1 wherein said semiconductor substrate comprises silicon.

15. A semiconductor device according to claim 14 wherein the silicon substrate has an electrical resistivity of less than about 3 mΩ.cm.

16. A semiconductor device according to claim 1 wherein said at least one resistivity-lowering body has a thermal resistivity lower than a thermal resistivity of said semiconductor substrate.

17. A semiconductor device according to claim 1 wherein said at least one resistivity-lowering body comprises at least one of copper, silver, aluminum, and solder.

18. A semiconductor device according to claim 1 wherein said at least one resistivity-lowering body comprises polysilicon.

19. A semiconductor device comprising:
   a semiconductor substrate having opposing first and second surfaces, and having at least one recess extending from the second surface into interior portions;
   at least one metal-oxide semiconductor field-effect transistor (MOSFET) active region formed in said semiconductor substrate adjacent the first surface thereof;
   a conduction terminal contact on the second surface of said semiconductor substrate; and
   at least one resistivity-lowering body positioned in said at least one recess of said semiconductor substrate and connected to said conduction terminal contact, said at least one resistivity-lowering body comprising a material different than said semiconductor substrate and having an electrical resistivity lower than an electrical resistivity of said semiconductor substrate.

20. A semiconductor device according to claim 19 wherein said at least one resistivity-lowering body fills an associated recess.

21. A semiconductor device according to claim 19 further comprising a barrier layer positioned between said at least one resistivity-lowering body and the corresponding recess.

22. A semiconductor device according to claim 19 wherein said at least one resistivity-lowering body comprises an electrical conductor having a resistivity less than about $10^{-4}$ Ω.cm.

23. A semiconductor device according to claim 19 wherein said at least one recess and associated resistivity-lowering body defines a proportion of the semiconductor substrate area adjacent said at least one MOSFET active region greater than about 0.4 percent.

24. A semiconductor device according to claim 19 wherein said at least one recess and associated resistivity-lowering body extends into said semiconductor substrate a distance greater than about 25 percent of a thickness of said semiconductor substrate.

25. A semiconductor device according to claim 19 wherein said at least one recess and associated resistivity-lowering body comprises an array of recesses and associated resistivity-lowering bodies.

26. A semiconductor device comprising:
   a semiconductor substrate having opposing first and second surfaces;
   at least one device active region formed in said semiconductor substrate adjacent the first surface thereof;
   an electrical contact layer on the second surface of said semiconductor substrate; and
   at least one resistivity-lowering body connected to said electrical contact layer and extending into interior portions of said semiconductor substrate, said at least one resistivity-lowering body comprising a material having an electrical resistivity lower than about $10^{-4}$ Ω.cm;
      said at least one resistivity-lowering body defining a proportion of the semiconductor substrate area adjacent said at least one device active region greater than about 0.4 percent and extending into said semiconductor substrate a distance greater than about 25 percent of a thickness of said semiconductor substrate.

27. A semiconductor device according to claim 26 further comprising a barrier layer positioned between said at least one resistivity-lowering body and adjacent portions of said semiconductor substrate.

28. A semiconductor device according to claim 26 wherein said at least one resistivity-lowering body comprises an array of resistivity-lowering bodies.

29. A semiconductor device according to claim 26 wherein said at least one device active region comprises at least one active region of a metal-oxide semiconductor field-effect transistor (MOSFET).

30. A semiconductor device according to claim 26 wherein said at least one device active region comprises at least one active region of an insulated gate bipolar transistor (IGBT).

31. A semiconductor device according to claim 26 wherein said at least one device active region comprises at least one active region of a microprocessor.

32. A semiconductor device comprising:
   a semiconductor substrate having opposing first and second surfaces;
   at least one device active region formed in said semiconductor substrate adjacent the first surface thereof;
   an electrical contact layer on the second surface of said semiconductor substrate; and
   at least one electrically conductive metal body connected to said electrical contact layer and extending into interior portions of said semiconductor substrate, said at least one electrically conductive metal body comprising a material having an electrical resistivity lower than an electrical resistivity of said semiconductor substrate.

33. A semiconductor device according to claim 32 wherein said at least one electrically conductive metal body comprises at least one of aluminum, copper, silver, and solder.

34. A semiconductor device according to claim 32 wherein said at least one electrically conductive metal body defines a proportion of the semiconductor substrate area adjacent said at least one device active region greater than about 0.4 percent.

35. A semiconductor device according to claim 32 wherein said at least one electrically conductive metal body extends into said semiconductor substrate a predetermined proportion of a thickness of said semiconductor substrate greater than about 25 percent.

36. A semiconductor device according to claim 32 wherein said at least one electrically conductive metal body comprises an array of bodies.

37. A semiconductor device according to claim 32 wherein said at least one device active region comprises at least one active region of a metal-oxide semiconductor field-effect transistor (MOSFET).

38. A semiconductor device according to claim 32 wherein said at least one device active region comprises at least one active region of an insulated gate bipolar transistor (IGBT).

39. A semiconductor device according to claim 32 wherein said at least one device active region comprises at least one active region of a microprocessor.

40. A semiconductor device comprising:
   a semiconductor substrate having opposing first and second surfaces, and having at least one recess extending from the second surface into interior portions;
   at least one device active region formed in said semiconductor substrate adjacent the first surface thereof;
   an electrical contact layer on the second surface of said semiconductor substrate; and
   at least one resistivity-lowering body positioned in said at least one recess of said semiconductor substrate and connected to said electrical contact layer, said at least one resistivity-lowering body comprising a material having an electrical resistivity lower than an electrical resistivity of said semiconductor substrate to thereby lower an effective electrical resistivity thereof.
      said at least one recess and associated resistivity-lowering body extending into said semiconductor substrate a distance greater than about 25 percent of a thickness of said semiconductor substrate.

41. A semiconductor device according to claim 40 wherein said at least one resistivity-lowering body comprises an electrical conductor having a resistivity less than about $10^{-4}$ Ω.cm.

42. A semiconductor device according to claim 40 wherein said at least one recess and associated resistivity-lowering body defines a proportion of the semiconductor substrate area adjacent said at least one device active region greater than about 0.4 percent.

43. A semiconductor device according to claim 40 wherein said at least one recess and associated resistivity-lowering body comprises an array of recesses and associated resistivity-lowering bodies.

44. A semiconductor device according to claim 43 wherein said array of recesses and associated resistivity-lowering bodies are arranged in a grid pattern.

45. A semiconductor device according to claim 40 wherein said at least one device active region comprises at least one active region of a metal-oxide semiconductor field-effect transistor (MOSFET).

46. A semiconductor device according to claim 40 wherein said at least one device active region comprises at least one active region of an insulated gate bipolar transistor (IGBT).

47. A semiconductor device according to claim 40 wherein said at least one device active region comprises at least one active region of a microprocessor.

48. A semiconductor device according to claim 40 wherein said at least one resistivity-lowering body comprises at least one of copper, silver, aluminum, and solder.

49. A semiconductor device according to claim 40 wherein said at least one resistivity-lowering body comprises polysilicon.

* * * * *

UNITED STATES PATENT AND TRADEMARK OFFICE
CERTIFICATE OF CORRECTION

PATENT NO. : 6,104,062  
DATED : August 15, 2000  
INVENTOR(S) : Jun Zeng

Page 1 of 2

It is certified that error appears in the above-identified patent and that said Letters Patent is hereby corrected as shown below:

| | |
|---|---|
| Column 1, Line 52 | Delete: "4.5 mΩ.cm"<br>Insert -- 4.5 mΩ•cm -- |
| Column 1, Line 53 | Delete: "0.16 mΩ.cm$^2$"<br>Insert -- 0.16 mΩ•cm$^2$ -- |
| Column 1, Line 60 | Delete: "mΩ.cm$^2$"<br>Insert -- mΩ•cm$^2$ -- |
| Column 2, Line 41 | Delete: "Ω.cm"<br>Insert --Ω•cm -- |
| Column 2, Line 51 | Delete: "3 mΩ.cm"<br>Insert --3 mΩ•cm -- |
| Column 6, Line 59 | Delete: "$10^{-4}$Ω.cm"<br>Insert --$10^{-4}$Ω•cm -- |
| Column 6, Line 61 | Delete: "$10^{-6}$Ω.cm"<br>Insert --$10^{-6}$Ω•cm -- |
| Column 6, Line 63 | Delete: "5 mΩ.cm"<br>Insert -- 5 mΩ•cm -- |
| Column 7, Line 20 | Delete: "4.5 mΩ.cm"<br>Insert -- 4.5 mΩ•cm -- |
| Column 7, Line 47 | Delete: "70 μΩ.cm$^2$"<br>Insert -- 70 μΩ•cm$^2$ -- |
| Column 8, Line 17 | Delete: "4.5 mΩ.cm"<br>Insert -- 4.5 mΩ•cm -- |
| Column 8, Line 45 | Delete: "mΩ.cm"<br>Insert -- mΩ•cm -- |

UNITED STATES PATENT AND TRADEMARK OFFICE
CERTIFICATE OF CORRECTION

PATENT NO. : 6,104,062
DATED : August 15, 2000
INVENTOR(S) : Jun Zeng

It is certified that error appears in the above-identified patent and that said Letters Patent is hereby corrected as shown below:

Column 10, Line 7    Delete: "$\Omega.cm$"
                     Insert -- $\Omega \bullet cm$ --

Column 10, Line 47   Delete: "$3\ m\Omega.cm$"
                     Insert -- $3\ m\Omega \bullet cm$ --

Column 11, Line 15   Delete: "$10^{-4}\Omega.cm$"
                     Insert -- $10^{-4}\Omega \bullet cm$ --

Column 11, Line 42   Delete: "$\Omega.cm$"
                     Insert -- $\Omega \bullet cm$ --

Column 12, Line 65   Delete: "$10^{-4}\Omega.cm$"
                     Insert -- $10^{-4}\Omega \bullet cm$ --

Signed and Sealed this

First Day of May, 2001

Attest:

NICHOLAS P. GODICI

Attesting Officer    Acting Director of the United States Patent and Trademark Office